United States Patent
Snider

(10) Patent No.: US 9,443,364 B2
(45) Date of Patent: Sep. 13, 2016

(54) MULTI-CONTROL ENTRY DOOR HARDWARE

(71) Applicant: Schlage Lock Company LLC, Indianapolis, IN (US)

(72) Inventor: Chris Ralph Snider, Noblesville, IN (US)

(73) Assignee: Schlage Lock Company LLC, Indianapolis, IN (US)

(*) Notice: Subject to any disclaimer, the term of this patent is extended or adjusted under 35 U.S.C. 154(b) by 211 days.

(21) Appl. No.: 14/175,782

(22) Filed: Feb. 7, 2014

(65) Prior Publication Data

US 2014/0218168 A1    Aug. 7, 2014

Related U.S. Application Data

(60) Provisional application No. 61/761,824, filed on Feb. 7, 2013.

(51) Int. Cl.
| | |
|---|---|
| G07C 9/00 | (2006.01) |
| G09G 3/04 | (2006.01) |
| H04B 17/318 | (2015.01) |
| G01R 31/36 | (2006.01) |
| H04B 17/23 | (2015.01) |

(52) U.S. Cl.
CPC .............. *G07C 9/00174* (2013.01); *G09G 3/04* (2013.01); *G01R 31/3689* (2013.01); *G07C 9/0069* (2013.01); *G09G 2340/14* (2013.01); *H04B 17/23* (2015.01); *H04B 17/318* (2015.01); *Y10T 70/8027* (2015.04)

(58) Field of Classification Search
USPC .......................................................... 340/5.5
See application file for complete search history.

(56) References Cited

U.S. PATENT DOCUMENTS

| | | | | |
|---|---|---|---|---|
| 2,831,129 A | * | 4/1958 | Penney .............. | G07C 9/00666 200/42.01 |
| 3,835,680 A | * | 9/1974 | Evans ................ | G07C 9/00698 200/310 |
| 4,899,562 A | * | 2/1990 | Gartner ............... | G07C 9/0069 70/277 |
| 5,061,923 A | * | 10/1991 | Miller ................ | G07C 9/00698 340/5.31 |
| 5,136,870 A | * | 8/1992 | Gartner ............... | G07C 9/0069 70/277 |
| 5,517,184 A | * | 5/1996 | Miller ..................... | E05B 37/00 340/5.28 |
| 5,604,489 A | * | 2/1997 | Hyatt, Jr. ........... | G07C 9/00698 340/5.3 |
| 5,609,051 A | * | 3/1997 | Donaldson .......... | E05B 47/0673 340/5.54 |
| 5,632,169 A | * | 5/1997 | Clark .................. | E05B 47/0688 340/5.31 |
| 5,870,914 A | * | 2/1999 | Dawson .................. | E05B 37/00 340/5.55 |
| 5,887,467 A | * | 3/1999 | Butterweck ............. | E05B 41/00 292/144 |
| 6,741,160 B1 | * | 5/2004 | Dawson ............. | G07C 9/00666 340/5.2 |

(Continued)

*Primary Examiner* — Brian Miller

(74) *Attorney, Agent, or Firm* — Taft Stettinius & Hollister LLP

(57) ABSTRACT

An electronic coded entry lock that includes a multifunction switch having an actuator and a circuit member. The actuator is configured to be displaced to a plurality of input positions. For example, the actuator may be displaced to at least four, and in some instances at least eight, input positions. Further, the actuator may have at least two axes of movement. Moreover, the actuator may be configured for two or three dimensional movement. When the actuator is displaced to an input position, the circuit member may provide a signal associated with that input position. The controller may determine whether the signals provided by the circuit member correspond to a security code for the electronic coded entry lock. If the signal(s) does/do correspond to the security code, the controller may generate a command to actuate a lock actuator that displaces at least a component of a lock mechanism.

20 Claims, 5 Drawing Sheets

(56) References Cited

U.S. PATENT DOCUMENTS

| | | | | |
|---|---|---|---|---|
| 6,813,917 B2 * | 11/2004 | Miller | ................ | E05B 17/2084 292/144 |
| 8,362,875 B2 * | 1/2013 | Morin | .................... | G06F 21/36 340/5.2 |
| 8,633,829 B2 * | 1/2014 | Cavanaugh | ......... | E05B 65/0075 235/130 R |
| 8,638,227 B2 * | 1/2014 | Yuan | ...................... | E05B 49/00 340/542 |
| 8,813,260 B2 * | 8/2014 | Eren | ....................... | G06F 21/34 726/34 |
| 2010/0042954 A1 * | 2/2010 | Rosenblatt | ............ | G06F 1/1626 715/863 |
| 2013/0055773 A1 * | 3/2013 | Li | ........................... | E05B 47/06 70/278.1 |
| 2015/0102610 A1 * | 4/2015 | Johnson | ............. | G07C 9/00174 292/144 |
| 2015/0211258 A1 * | 7/2015 | Gokcebay | ................ | E05B 47/00 70/278.1 |

* cited by examiner

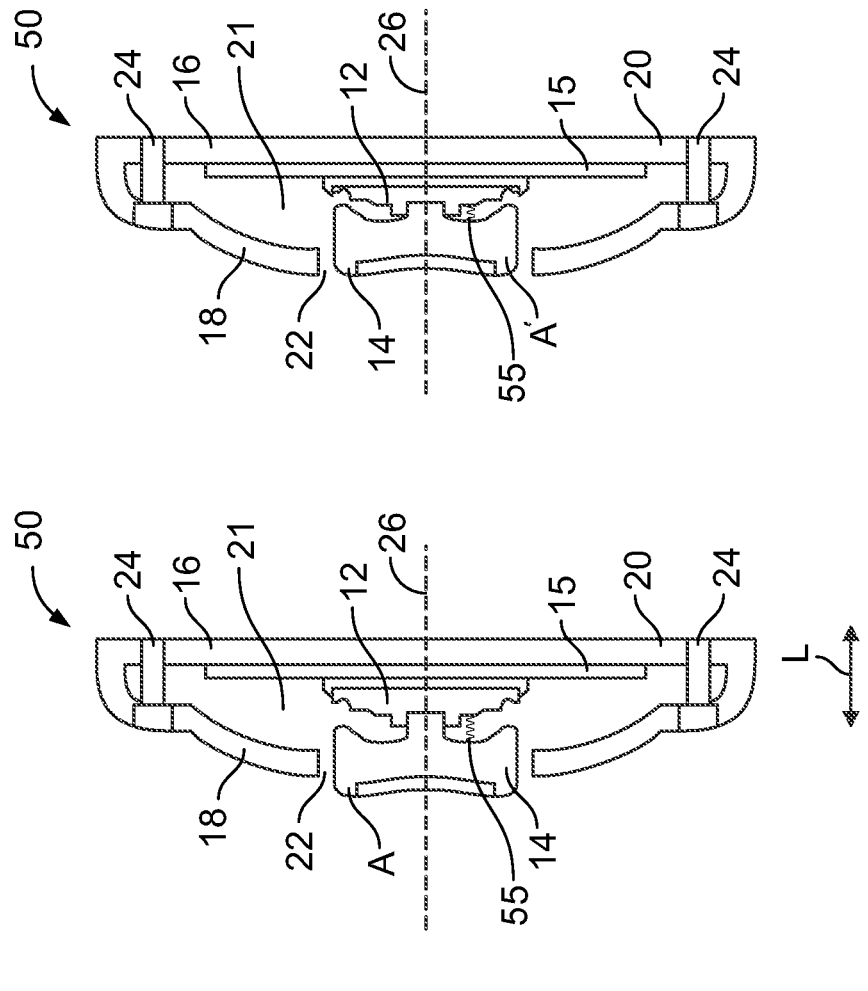
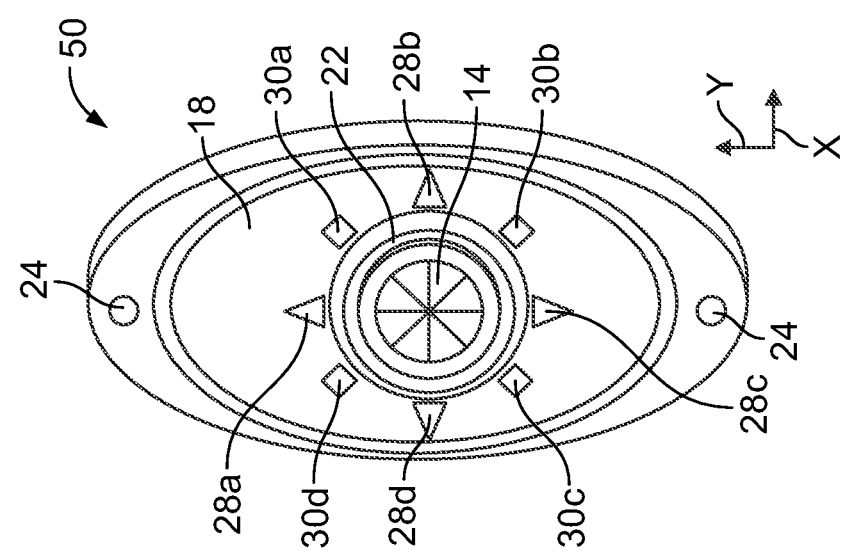
FIG. 3B
FIG. 3A
FIG. 2

MULTI-CONTROL ENTRY DOOR HARDWARE

RELATED APPLICATIONS

This application claims the benefit of U.S. Provisional Application No. 61/761,824, filed Feb. 7, 2013, which is incorporated herein by reference in its entirety.

BACKGROUND OF THE INVENTION

Entry doors often include hardware in the form of a security mechanism to control ingress and egress through an entry. Security mechanisms may take a variety of different forms, such as, for example, electronic coded entry locks. Often, operation of electronic coded entry locks is controlled by a numerical style keypad. More specifically, through the use of the individual keys of the keypad, a user may input a security code that initiates a protocol that drives components of the electronic coded entry lock to lock or unlock the electronic coded entry lock, and/or open or close the entry door.

For example, the opening and closing of a garage door may be controlled via a remote keypad that is positioned adjacent to the garage door. Such keypads often have a telephone style keypad configuration that includes a plurality of keys having numeric values and/or alphabetic letters. Yet, such keypads often have a relatively large configuration, which may result in the associated keypad housing occupying a relatively large area or amount of real estate. Further, such keypad housings often include a hinged door that protects the keypad. Yet, the inclusion of a hinged door typically adds to the overall size and/or bulk of the keypad housing. Further, in at least certain situations, the size of the keypad housing may result in the keypad housing detracting from the ornamental or decorative style of the associated entry door or structure.

Additionally, keypads associated with electronic coded entry locks are often illuminated to assist the user in locating and identifying particular keys of the keypad. Yet, such illumination, particularly with the relatively large size of telephone style keypads, may consume relatively large amounts of electrical power. Additionally, the relatively large size of the keypad may translate into slower time, or more concentration, on the part of the user when locating the specific key(s) that is/are to be pressed when entering the security code via the keypad. The relatively large size of the keypad may also make the entering of the security code via the keypad more discernible to others, thereby potentially comprising the security provided by the electronic coded entry lock. Further, over time, a wear pattern may develop on the particular keys that are pressed when entering the security code, which may provide an indication of the correct security code, and thereby compromise the security of the electronic coded entry lock.

BRIEF SUMMARY OF THE INVENTION

One aspect of the present invention is an electronic coded entry lock that includes a multifunction switch and a controller. The multifunction switch includes an actuator and a circuit member. The actuator is configured to be displaced to a plurality of input positions. Additionally, when the actuator is displaced to an input position, the circuit member is configured to provide a signal associated with that input position. Further, the controller is configured to generate a command to actuate the electronic coded entry lock when a plurality of the signals provided by the circuit member correspond to a security code.

Another aspect of the present invention is an electronic coded entry lock that includes a multifunction switch that has an actuator, a circuit member, and at least four input positions. The actuator is configured to be displaced at least along to two axes of movement. Further, the circuit member is configured to, when the actuator is displaced to an input position, provide a signal associated with the input position. The electronic coded entry lock also includes a controller that is configured to generate a command to actuate the electronic coded entry lock when a plurality of the signals provided by the circuit member correspond to a security code.

Another aspect of the present invention is an electronic coded entry lock that includes a user interface that has a multifunction switch. The multifunction switch includes an actuator, a circuit member, and a plurality of input positions. The actuator is configured for at least two dimensional movement. Additionally, the circuit member is configured to, when the actuator is displaced to an input position of the plurality of input positions, transmit a signal that is associated with the input position. The electronic coded entry lock also includes a controller that is operably connected to the circuit member. The controller is configured to determine whether one or more of the signals transmitted by the circuit member corresponds to a security code. Additionally, the controller is configured to generate a command to actuate the electronic coded entry lock when a plurality of the signals provided by the circuit member correspond to the security code. The electronic coded entry lock further includes a lock actuator that is operably connected to the controller. The lock actuator is configured to, upon receipt of a command from the controller, actuate the displacement of at least a portion of a lock mechanism to lock or unlock the electronic coded entry lock.

BRIEF DESCRIPTION OF SEVERAL VIEWS OF THE DRAWINGS

FIG. 2 illustrates a front side perspective view of at least a portion of a user interface according to an embodiment of the present invention.

FIGS. 3A and 3B illustrate side cross-sectional views of the user interface shown in FIG. 2 with the actuator at a rest position and at a lateral input position, respectively.

Figure 1:
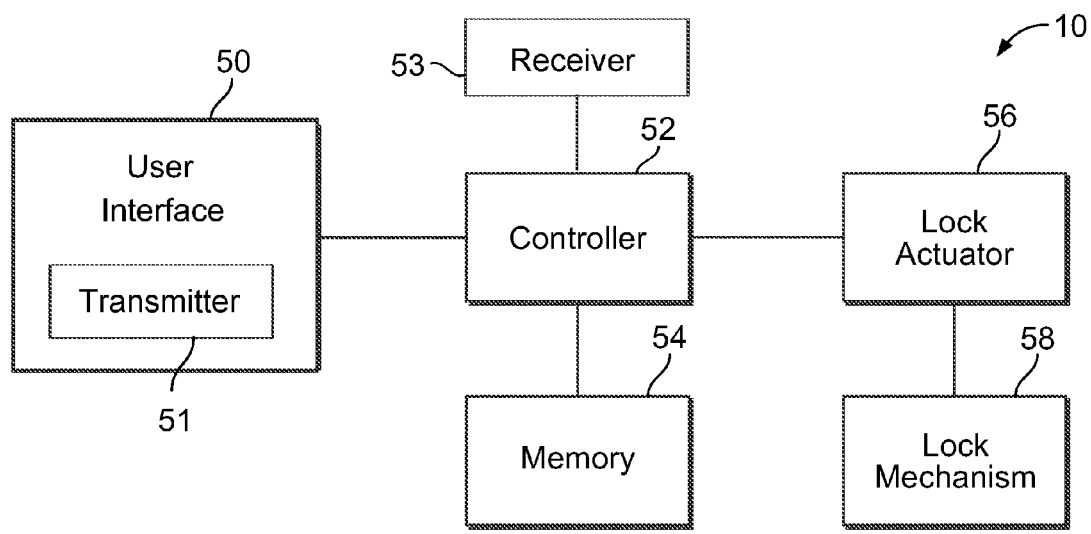
FIG. 1 illustrates an block diagram of an electronic coded entry lock according to an embodiment of the present invention.

The foregoing summary, as well as the following detailed description of certain embodiments of the present invention, will be better understood when read in conjunction with the appended drawings. For purposes of illustrating the invention, there is shown in the drawings, certain embodiments. It should be understood, however, that the present invention is not limited to the arrangements and instrumentalities shown in the attached drawings.

DETAILED DESCRIPTION OF THE INVENTION

FIG. 1 illustrates a block diagram of an electronic coded entry lock 10 according to an embodiment of the present invention. The electronic coded entry lock 10 includes a user interface 50 through which a user may at least input a security code. The inputted security code may be used to control the unlocking and locking of the electronic coded entry lock 10 and/or for opening and closing the associated entry door. The user interface 50 may receive electrical power from a variety of different power sources. For example, according to certain embodiments, the user interface 50 may be battery powered. However, according to other embodiments, the user interface 50 may hardwired to a central power source, such as, for example, being wired to a circuit that also provides electrical power for a door bell.

The user interface 50 may be housed with, or be remote from, a controller 52, such as, for example, a microprocessor, that is configured to control the operation of a lock actuator 56. A signal representative of the security code inputted via the user interface 50, or components thereof, may be transmitted from the user interface 50 to a controller 52 via wired or wireless connection. Such signals provided from the user interface 50 may take a variety of different forms, including, for example, being an electric current, an indication of a break in a circuit, or a radio signal or frequency, among other signals. For example, according to certain embodiments, the user interface 50 may include a transmitter 51 that transmits radio signals indicative of the security code entered by the user to a receiver 53 of the controller 52. Alternatively, according to other embodiments, wire routing may be used to route signals, such as, for example, an electrical current, from the user interface 50 to the controller 52.

The controller 52 may include or be operably connected to a memory 54. According to certain embodiments, the memory 54 may be used by the controller 52 in determining whether the signal(s) received from the user interface 50 match(es) a valid security code stored or recorded by the memory 54. According to certain embodiments, if the controller 52 determines a valid entry code has been entered via the user interface 50, the controller 52 may activate the lock actuator 56 so as to engage or disengage a lock mechanism 58. A variety of different lock actuators 56 may be employed, including, for example, a motor or solenoid, among other actuators. The lock actuator 58 may cause or facilitate the displacement of a least a portion of the lock mechanism 58, such as, for example, the displacement of a dead bolt, belt, or pulley and cable, among other lock mechanisms.

FIGS. 2, 3A, and 3B illustrate a front side perspective view and side cross sectional views, respectively, of at least a portion of the user interface 50 according to an embodiment of the present invention. According to certain embodiments, the user interface 50 may include a multifunction switch 12 and a housing 16. In the illustrated embodiment, the multifunction switch 12 includes an actuator 14 and a circuit member 15. According to the embodiment illustrated in FIGS. 2A-3B, the circuit member 15 is a circuit board to which the actuator 14 may be mounted or otherwise operably engage. The housing 16 may include a front portion 18 and a rear portion 20 that generally define an inner region 21, the inner region 21 being sized to house the circuit member 15 and at least a portion of the actuator 14. The housing 16 may also be configured for attachment to an entry door, wall or other structure. For example, in the embodiment illustrated in FIGS. 2, 3A, and 3B, the housing 16 includes one or more orifices 24 that are configured to receive the insertion of a fastener, such as, for example, a bolt or screw, that is used in securing the user interface 50 to an adjacent structure.

As shown in at least FIG. 3A, according to certain embodiments, at least a portion of the actuator 14 may protrude through an aperture 22 in the front portion 18 of the housing 16. According to such embodiments, the aperture 22 is sized to accommodate the movement and/or displacement of at least a portion of the actuator 14 about and/or through the aperture 14. However, according to other embodiments, the actuator 12 is recessed within the inner region 21 of the housing 16 and is accessible to a user, such as, for example, by at least a single digit of the user entering into and through the aperture 22.

The actuator 14 is configured for displacement relative to at least a central actuator axis 26. For example, the actuator 14 may be configured to be displaced, pivoted, or otherwise bent or deflected from at least an initial rest position, as shown in FIGS. 2 and 3A, in a direction generally along at least one of two axes, such as, for example, the X axis and/or Y axis (as indicated in FIG. 2). Such movement along the X and Y axes may allow the actuator 14 to be moved to at least two input positions. Moreover, according to certain embodiments, the actuator 14 may be displaced to at least four input positions (also referred to as four-way) generally along the X and Y axes as shown, for example, by the four arrow input positions 28a-d in FIG. 2.

Further, according to certain embodiments, the actuator 14 may have two at least two dimensions of movement so that the actuator 14 may pivoted to input positions along and between both the X and Y axes. According to such embodiments, the actuator 14 may be displaced to at least three input positions. Moreover, according to certain embodiments, the actuator 14 may be moved to at least eight input positions (also referred to as eight-way), such as, for example, both the four arrow input positions 28a-d and the four dash input positions 30a-d shown in FIG. 2.

In addition to being displaced along the X axis, Y axis, and/or there between, the actuator 14 may also be laterally displaced (as indicated by the "L" direction in FIG. 3A) generally along the central actuator axis 26. Such lateral displacement may include the actuator 14 being generally pushed toward and/or pulled away from the inner region 21 of the housing 16. For example, FIG. 3A illustrates the actuator 14 at a rest, or first, position A, while FIG. 3B illustrates the actuator 14 displaced to lateral input position A. Thus, in reference to the previous example, according to certain embodiments, the actuator 14 may be displaced to nine different input positions, as indicated, for example, by the four arrow input positions 28 a-d and the four dash input positions 30 a-d shown in FIG. 2, as well as the lateral input position A' shown in FIG. 3B. Alternatively, such lateral displacement of the actuator 14 may be used to operate as a door bell. More specifically, according to certain embodiments, the pushing of the actuator 14 to a lateral input position A' may close a circuit so that a signal in the form of an electrical current may be delivered to operate a door bell chime. According to another embodiment, the lateral displacement of the actuator 14 may activate or otherwise awaken the user interface 50, such as, for example, awaking the user interface 50 from a sleeping or standby mode. Further, according to certain embodiments, when not displaced by the user, the actuator 14 may be biased by a biasing element 55 to the rest or first position as shown in FIG. 3A, such as, for example, by a spring and/or by the resiliency of the material of the actuator 14.

Figure 4:
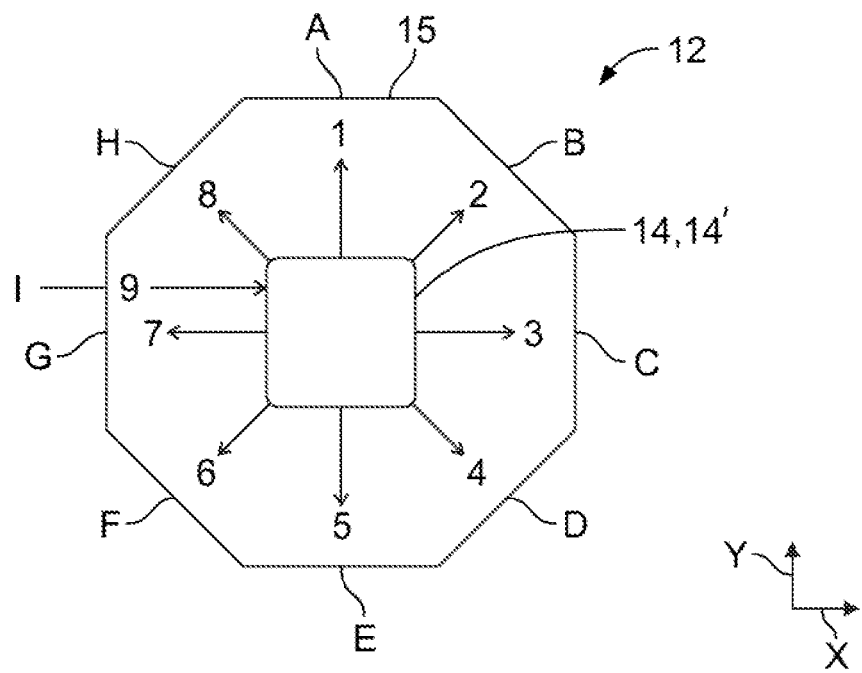
FIG. 4 illustrates a front view of a multifunction switch for the electronic coded entry lock according to an embodiment of the present invention.
Figure 5:
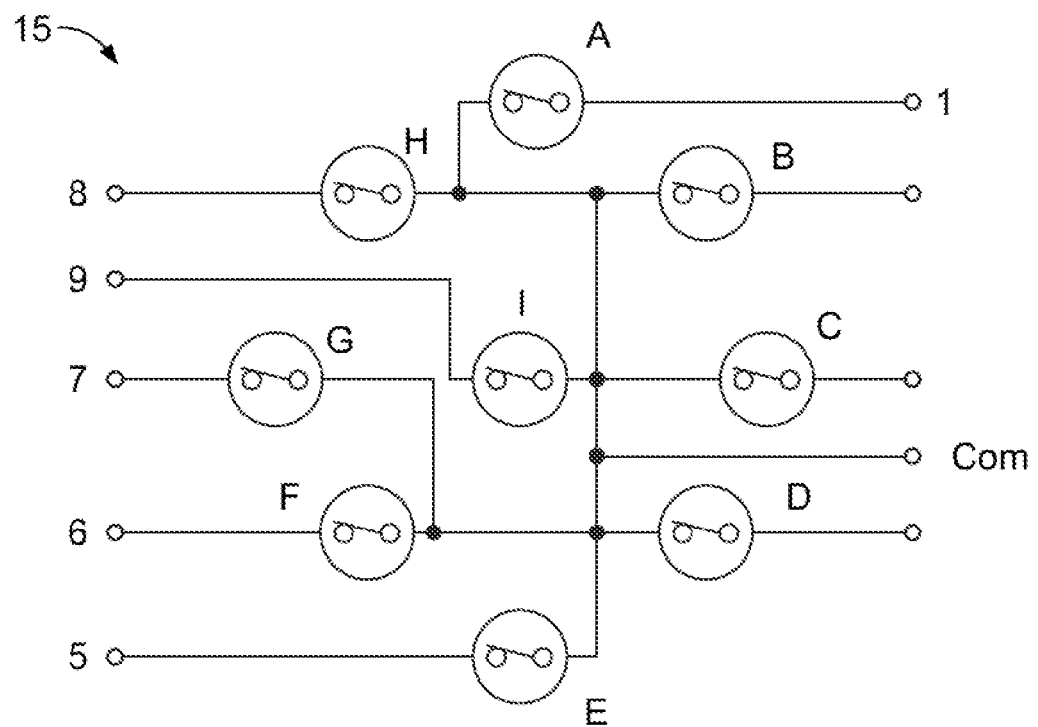
FIG. 5 illustrates an exemplary circuit diagram for use with the electronic coded entry lock according to an embodiment of the present invention.

FIGS. 4 and 5 show, for illustration purposes, a multifunction switch 12 and an associated circuit diagram for the circuit member 15, respectively. A variety of different types of circuit members 15 may be used, including, for example, a circuit board or discrete wire soldered to electrical contacts, among other circuit members. In the illustrated embodiment, the multifunction switch 12 is shown as detecting nine input positions of the actuator 14, namely input positions 1-9. For example, as shown, input positions 1-8 may correspond to the displacement of the actuator 14 along and between the X and Y axes, while input position 9 may correspond to lateral input position along the central actuator axis 26, as shown in FIG. 3B. Additionally, each of input positions 1-9 has an associated circuit, as represented by circuits A-I. The displacement of the actuator 14 to one of input positions 1-9 may result in the activation of the circuit A-I associated with that particular input position 1-9. According to such an embodiment, activation of the associated circuit A-I may result in a signal indicative of that particular associated input position 1-9 being sent to, or otherwise detected by, the controller 52 and/or to operate a door bell chime, as previously discussed.

Figure 6:
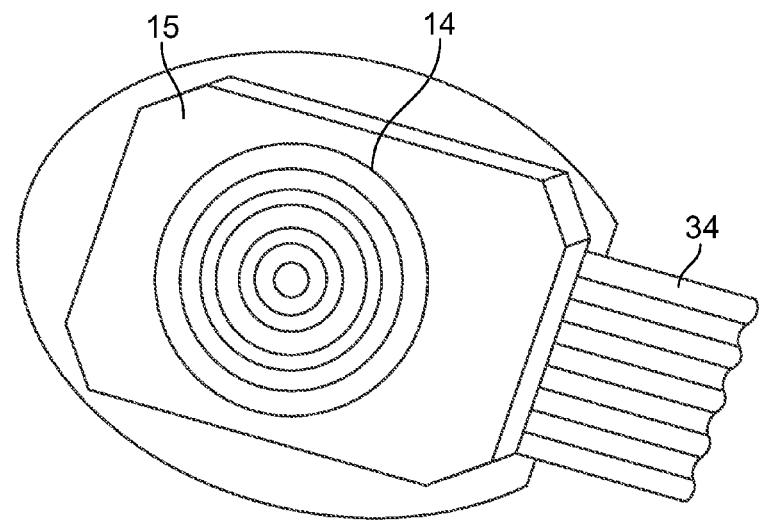
FIG. 6 illustrates a front view of a multifunction switch having wire routing according to an embodiment of the present invention.

For example, according to an illustrated embodiment, when the actuator 14 is moved to input position 1, circuit A may be moved from a normally open position to a closed position. With circuit A in a closed position, a current may pass through circuit A and be transmitted or otherwise delivered to, or a corresponding signal detected by, the controller 52. Referencing FIG. 6, as previously discussed, according to certain embodiments, wire routing 34 may be used in routing the electrical current that passes through closed circuit A to the controller 52. The actuator 14 may then be subsequently moved from input position 1 (thereby breaking circuit A) to the rest position, as shown in FIG. 3A, and/or back to the same or another of the input position 1-9 to close the associated circuit A-I.

As a further example, the displacement of the actuator 14 to selected input positions 1-9, and associated closing and/or opening of circuits A-I, may follow a sequence that corresponds to a security code of the electronic coded entry lock 10. For instance, if the security code is 1-2-3, the actuator 14 may be (1) moved to input position 1 (closing circuit A), then (2) moved from input position 1 (opening circuit A) and to input position 2 (closing circuit B), and then (3) moved from input position 2 (opening circuit B) and to input position 3 (closing circuit C). The signals associated with the sequential opening and/or closing of circuits A, B, and C that are transmitted to the controller 52 may be evaluated by the controller 52 to determine if the signals correspond to a valid security code. In the event the transmitted signals match a valid security code, the controller 52 may provide a signal to actuate the lock actuator 56, as previously discussed.

While the above examples describe circuits A-I as being normally open, according to other embodiments, circuits A-I may be in normally closed positions. According to such embodiments, the displacement of the actuator 14 to one of input positions 1-9 results in a break of associated circuit A-I, with the break being communicated or otherwise detected by the controller 52. The subsequent movement of the actuator 14 from the input position 1-9 may then allow the associated circuit A-I to return to its normally closed position.

Figure 7:
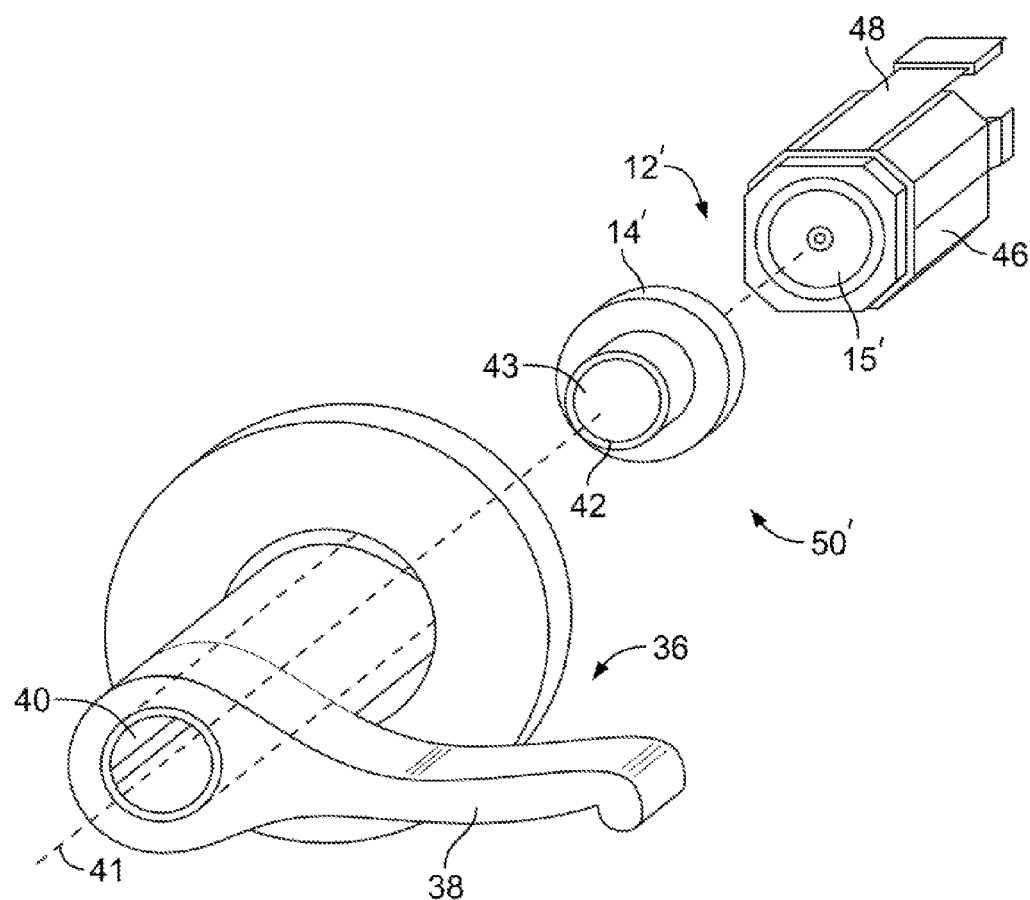
FIG. 7 illustrates an exploded view of a user interface that is configured to be housed in entry door hardware according to an embodiment of the present invention.

FIG. 7 illustrates an exploded view of a user interface 50' that is configured to be housed in the entry door hardware 36 according to an embodiment of the present invention. For example, the entry door hardware 36 shown in FIG. 7 includes a lever 38 having an orifice 40 that is configured to house the circuit member 15' and at least as portion of the multifunction switch 12'. Moreover, according to certain embodiments, at least a portion of the actuator 14' may be recessed in the aperture 40. Thus, the aperture 40 may be configured to accommodate the movement and/or displacement of at least a portion of the actuator 14' about the aperture 40 as the actuator 14' is displaced to input positions, as previously discussed.

According to the embodiment illustrated in FIG. 7, the circuit member 15' may be operably connected to a support body 46 that supports the multifunction switch 12' in the aperture 40 of the lever 38. For example, according to certain embodiments, the circuit member 15' may be connected to the support body by a mechanical fastener or adhesive, or may be integrally molded to and/or within the support body 46, among other connections. Further, according to certain embodiments, the support body 46 may allow the multifunctional switch 12' to remain relatively static as the lever 38 is rotably displaced about a central axis 41 of the aperture 40. The support body 46 may also include, or be operably connected to a wire harness 48, such as, for example, a wire assembly, wire loom, straps, cable ties, or sleeve, among others, that at least assists in securing and routing wires of the multifunction switch 12' through the aperture 40.

Figure 8:
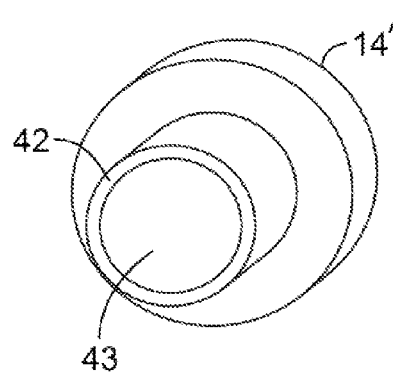
FIG. 8 illustrates a front side perspective view of an actuator of an electronic coded entry lock according to an embodiment of the present invention.

According to the embodiment illustrated in FIGS. 7 and 8, a front wall 42 of the actuator 14' is generally aligned or flush with a front surface 44 of the lever 38. According to such an embodiment, the user may manipulate and/or displace the actuator 14' to a input position by engaging a digit of the user with the front wall 42 of the actuator 14'. Further, as shown by at least FIG. 9, according to certain embodiments, in an effort to at least assist in the ease with which a user may move the actuator 14' to input positions, the front wall 42 of the actuator 14' may include a recessed portion 43 that is configured to receive at least a portion of the user's digit. The concave shape of the recessed portion 43 may provide surfaces against which the user's digit may press against or otherwise engage as the user displaces the actuator 14' to a input position.

Figure 9:
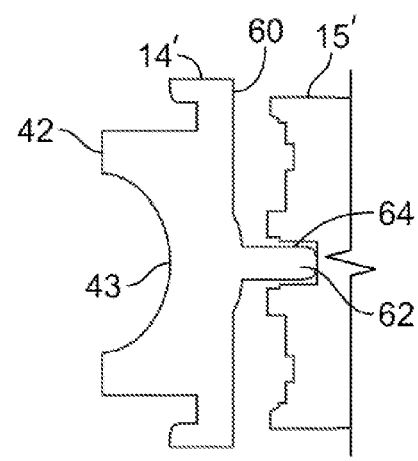
FIG. 9 illustrates a side cross sectional view of the actuator of FIG. 8 and a portion of a circuit member according to an embodiment of the present invention.

Referencing FIG. 9, according to certain embodiments, a rear portion 60 of the actuator 14' includes a protrusion 62 that engages at least a portion of the circuit member 15'. More specifically, according to certain embodiments, the protrusion 62 may pivot, deflect, or otherwise be displaced within a cavity 64 of the circuit member 15' as the actuator 14' is displaced to an input position. According to certain embodiments, the position of the protrusion 62 relative to the cavity 64 may result in the circuit member 15' providing a signal indicative of the input position of the actuator 14'. For example, referencing FIGS. 4, 5, and 9, the displacement of the actuator 14' to input position 1 may result in the protrusion 62 moving within the cavity 64 to a position that establishes an electrical connection that closes circuit A. Further, this established electrical connection may result signal being transmitted from the circuit member 15' to the controller 52 that is indicative of the actuator 14' being in input position 1. As previously discussed, the subsequent displacement and/or repositioning of the actuator 14' may result in the transmission of a plurality of signals to the controller 52 that correlate to a security code used in the locking/unlocking of the lock mechanism 58 and/or opening/closing of an entry door.

Figure 10:
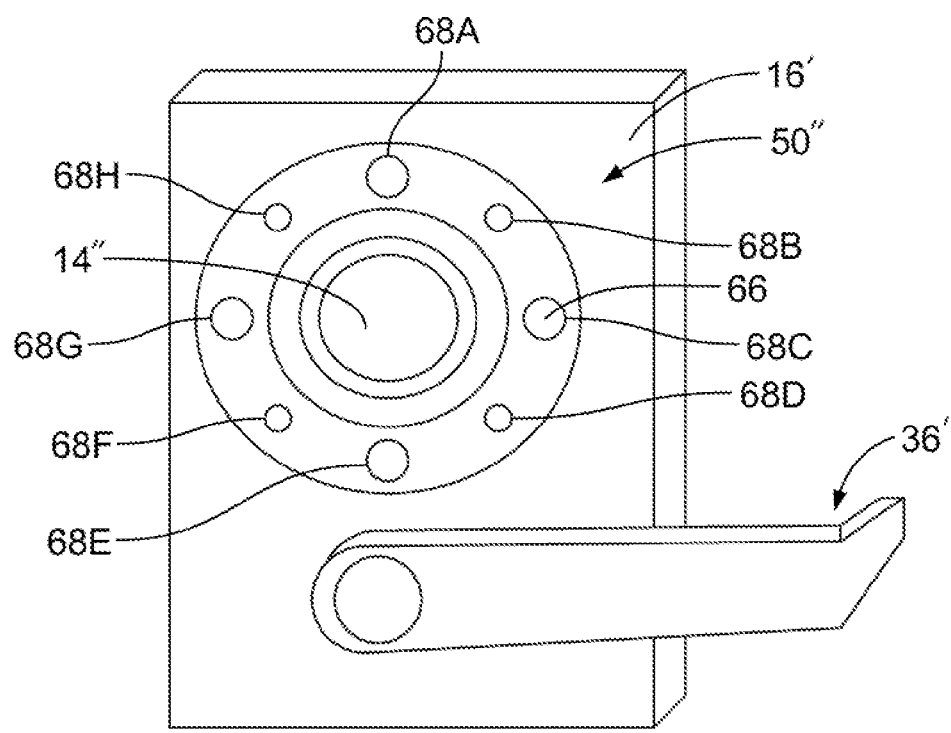
FIG. 10 illustrates a front view of a portion of a user interface and entry hardware according to an embodiment of the present invention.
Figure 11:
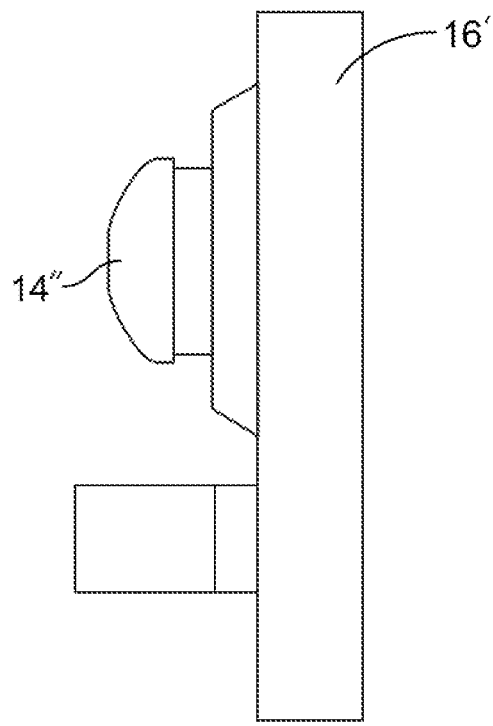
FIG. 11 illustrates a side view of the user interface and entry hardware of FIG. 10.

FIGS. 10 and 11 illustrate an embodiment of a user interface 50" that includes an enlarged actuator 14" mounted to and/or in a housing 16', and which is adjacent to entry door hardware 36'. The enlarged actuator 14" may increase the ease of use of the user interface 50" for at least some users, including, for example, users with physical handicaps. For example, in the embodiment shown in FIGS. 10 and 11, the actuator 14" may be sized for engagement with at least the palm of a user.

Additionally, the user interface 50" shown in FIGS. 10 and 11 includes a display 66 for providing a visual indication of at least a portion of the available input positions and/or the input positions selected by the user during displacement of the actuator 14". For example, in the illustrated embodiment, the display 66 includes a plurality of lights 68A-H, such as, for example, light emitting diodes (LED), that may provide an indication of available input positions and/or the input position to which the actuator 14" has been displaced. At least a portion of the display 66 may be illuminated when the user interface 50" is activated and/or when the actuator 14" is displaced to an input position.

For example, according to certain embodiments, a user may at least initially engage the actuator 14", such as by pushing the actuator 14" to a lateral input position, to activate and/or electronically awaken the user interface 50". According to some embodiments, at least a portion of the display 66 may be illuminated by the activation of the user interface 50" to indicate at least a portion of the available input positions. Further, according to certain embodiments, when the actuator 14" is subsequently displaced to an input position, the display 66 may provide an indication of the selected input position, such as, for example, turning the illumination of the light 68A-H associated with that input position on, off, or a combination thereof. The display 66 may also provide an indication of when a correct or incorrect security code has been inputted by the user, such as, for example, by a flashing of the lights 68A-H of the display 66. Further, according to certain embodiments, the user interface 50" or controller 52 may be configured to cease the supply of electrical power to the display 66 after a user has entered a valid security code, after a predetermined period of time of inactivity of the user interface 50", and/or upon deactivation of the user interface 50".

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. An electronic coded entry lock comprising:
    a multifunction switch having an actuator and a circuit member, the actuator configured to be displaced along at least three axes to a plurality of input positions, the plurality of input positions including at least a lateral input position and at least two code input positions, the circuit member configured to, when the actuator is displaced to a code input position of the at least two code input positions, provide a first signal associated with the code input position; and
    a controller configured to generate a command to actuate the electronic coded entry lock when a plurality of the first signals provided by the circuit member correspond to a security code,
    the actuator being laterally displaced from a rest position to the lateral input position along a central axis of the actuator, the actuator structured to close a circuit of the circuit member when the actuator is at the lateral input position, the closed circuit configured to generate a second signal for at least one of an electrical wake up of the circuit member and a door bell chime, the second signal being generated independent of the actuator being placed at any of the at least two code input positions.

2. The electronic coded entry lock of claim 1, wherein the actuator is configured for movement along at least a first axis and a second axis of the at least three axes, the first axis and the second axis being different than the central axis, and wherein the at least two code input positions comprises at least four code input positions.

3. The electronic coded entry lock of claim 2, wherein electronic coded entry lock further includes a biasing element structured to bias the actuator to the rest position.

4. The electronic coded entry lock of claim 1, wherein the actuator is configured for at least two dimensional movement, and wherein the at least two axial input positions comprises at least eight input positions.

5. The electronic coded entry lock of claim 4, wherein the actuator is configured to be displaced to the at least two code positions in directions that are not parallel to the central axis of the actuator.

6. The electronic coded entry lock of claim 1, further including a lock actuator and a lock mechanism, the lock actuator configured to, upon receipt of the command from the controller, actuate the displacement of at least a portion of a lock mechanism to lock or unlock the electronic coded entry lock.

7. The electronic coded entry lock of claim 1, wherein the multifunction switch includes a radio frequency transmitter that is configured to transmit one or more of the first signals to a receiver, the receiver being operably connected to the controller.

8. The electronic coded entry lock of claim 1, wherein the displacement of the actuator to each of the plurality of code positions closes a circuit of the circuit member that is associated with the code position, and wherein the first signal is an electrical current.

9. The electronic coded entry lock of claim 8, wherein the displacement of the actuator to the code input position of the plurality of code input positions opens a circuit of the circuit member that is associated with the code input position, and wherein the first signal is the stoppage in flow of an electrical current circuit.

10. The electronic coded entry lock of claim 1, further comprising a display, the display being configured to provide a visual indication of the plurality of code input positions.

11. An electronic coded entry lock comprising:
a multifunction switch having an actuator, a circuit member, and at least four code input positions, the actuator configured to be displaced at least along to two axes of movement relative to, and different than, the actuator further configured to be laterally displaced to a lateral input position along the central axis and in a direction that is different than the two axes of movement, the circuit member configured to, when the actuator is displaced to a code input position of the at least four code input positions, provide a first signal associated with the code input position, and further wherein when the actuator is at the lateral input position a first circuit of the circuit member is closed, the first circuit structured to communicate, independent of the displacement of the actuator any of the at least four code positions, a second signal when the first circuit is closed, the second signal being at least one of an electronic wake signal and a doorbell chime signal; and
a controller configured to generate a command to actuate the electronic coded entry lock when a plurality of the first signals provided by the circuit member correspond to a security code.

12. The electronic coded entry lock of claim 11, wherein the electronic coded entry lock further includes a biasing element structured to bias the actuator to a rest position, the rest position being a different position than the lateral input position.

13. The electronic coded entry lock of claim 11, wherein the actuator is configured for at least two dimensional movement, and wherein the at least four input positions comprises at least eight input positions.

14. The electronic coded entry lock of claim 13, wherein the actuator is pivotally displaceable relative to the central axis.

15. The electronic coded entry lock of claim 11, further including a lock actuator and a lock mechanism, the lock actuator configured to, upon receipt of the command from the controller, actuate the displacement of at least a portion of a lock mechanism to lock or unlock the electronic coded entry lock.

16. The electronic coded entry lock of claim 11, wherein each of the at least four code input positions is associated with a circuit of the circuit member, and wherein the displacement of the actuator to each of the code input positions of the at least four code input positions closes the circuit associated with the code input position, and wherein the first signal is an electrical current.

17. The electronic coded entry lock of claim 11, further comprising a display, the display being configured to provide a visual indication of the at least four code input positions.

18. An electronic coded entry lock comprising:
a user interface having a multifunction switch, the multifunction switch having an actuator, a circuit member, and a plurality of input positions, the actuator configured for at least three dimensional movement, the circuit member configured to, when the actuator is displaced to a code input position of the plurality of code input positions, transmit a first signal that is associated with the code input position, the actuator being structured to close a circuit of the circuit member when the actuator is in the lateral input position, the circuit configured to, when closed, transmit a second signal, the second signal being independent of the first signal, the displacement of the actuator to the lateral input position being in a direction that is different than a direction of displacement of the actuator to the plurality of code input positions;
a controller operably connected to the circuit member, the controller configured to determine whether one or more of the signals transmitted by the circuit member corresponds to a security code, the controller further configured to generate a command to actuate the electronic coded entry lock when a plurality of the first signals provided by the circuit member correspond to the security code; and
a lock actuator operably connected to the controller, the lock actuator configured to, upon receipt of a command from the controller, actuate the displacement of at least a portion of a lock mechanism to lock or unlock the electronic coded entry lock.

19. The electronic coded entry lock of claim 18, wherein the second signal is at least one of a door bell chime signal and an electrical wake up signal for the user interface.

20. The electronic coded entry lock of claim 18, wherein the user interface further includes a display, the display being configured to provide a visual indication of the at least four code input positions.

* * * * *